United States Patent
Dykstra

(10) Patent No.: US 9,124,265 B2
(45) Date of Patent: Sep. 1, 2015

(54) METHOD AND APPARATUS FOR TRANSISTOR SWITCH ISOLATION

(75) Inventor: Jeffrey A. Dykstra, Palatine, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 851 days.

(21) Appl. No.: 13/182,330

(22) Filed: Jul. 13, 2011

(65) Prior Publication Data

US 2013/0015717 A1    Jan. 17, 2013

(51) Int. Cl.
*H01H 47/00*    (2006.01)
*H03K 17/00*    (2006.01)
*H03K 17/693*   (2006.01)

(52) U.S. Cl.
CPC ............ *H03K 17/005* (2013.01); *H03K 17/693* (2013.01)

(58) Field of Classification Search
CPC ..................... H03K 17/005; H03K 17/693
USPC ......................................... 307/112
See application file for complete search history.

(56) References Cited

U.S. PATENT DOCUMENTS

| | | | | |
|---|---|---|---|---|
| 5,917,362 A * | 6/1999 | Kohama | ................. | 327/408 |
| 5,945,867 A * | 8/1999 | Uda et al. | .................. | 327/431 |
| 7,636,004 B2 * | 12/2009 | Nakatsuka et al. | .......... | 327/308 |
| 7,692,514 B2 * | 4/2010 | LeToux | .................. | 333/101 |
| 8,583,111 B2 * | 11/2013 | Burgener et al. | ............. | 455/433 |
| 2006/0001473 A1 * | 1/2006 | Yasuda et al. | .................. | 327/415 |
| 2006/0103448 A1 * | 5/2006 | Nakatsuka et al. | .......... | 327/430 |
| 2007/0018247 A1 * | 1/2007 | Brindle et al. | ................ | 257/347 |
| 2009/0261868 A1 * | 10/2009 | Lu et al. | ....................... | 327/118 |

OTHER PUBLICATIONS

Demurie, S. & De Mey, G. (1989). Parasitic Capacitance Effects of Planar Resistors. IEEE Transactions on Components, Hybrids, and Manufacturing Technology, 12(3), 348-351.*

* cited by examiner

*Primary Examiner* — Jared Fureman
*Assistant Examiner* — Joel Barnett
(74) *Attorney, Agent, or Firm* — Jaquez Land Richman LLP; Martin J. Jaquez, Esq.; Alessandro Steinfl, Esq.

(57) ABSTRACT

A transistor switch that provides isolation is described. The transistor switch is adapted to receive an input signal at an input terminal and either transmit the input signal to an output terminal when the transistor switch is in a first state or ground the input signal when the transistor switch is in a second state. The transistor switch comprises series switches, which couple the input terminal to the output terminal when the transistor switch is in the first state; shunt switches, which couple the input terminal to ground when the transistor switch is in the second state; and filters to provide isolation between the input terminal and the output terminal.

20 Claims, 7 Drawing Sheets

METHOD AND APPARATUS FOR TRANSISTOR SWITCH ISOLATION

FIELD

The present disclosure relates to a transistor switch. More particularly, the disclosure relates to a method and apparatus for transistor switch isolation.

BACKGROUND

In any given circuit arrangement, signals to and from various components (e.g., switches, amplifiers, etc.) that form the circuit arrangement can couple to one another. The isolation of a particular component provides a measure of coupling between signals of the particular component with signals from other components.

Design of a switch generally involves consideration of isolation and insertion loss. In a general case, a closed switch (i.e., in an ON state) couples a signal from an input terminal to an output terminal while the same switch when open (i.e., in an OFF state) prevents the signal at the input terminal from being coupled to the output terminal. Isolation is generally considered for switches in the OFF state and can be given, for example, by scattering parameters. An example would be obtaining scattering parameter $|S_{21}|$ at a frequency of interest (generally an operating frequency of the switch), which provides a ratio between an output of the switch to an input of the switch at the frequency of interest. Similarly, insertion loss is generally considered for switches in the ON state and can also be given by scattering parameter $|S_{21}|$ at a frequency of interest. Specifically, $|S_{21}|$ provides one possible measure of isolation when the switch is OFF while $|S_{21}|$ provides one possible measure of insertion loss when the switch is ON.

SUMMARY

According to a first aspect, a switching arrangement adapted to receive an input signal and either transmit the input signal or ground the input signal is provided, the switching arrangement comprising: a plurality of filters, wherein each filter in the plurality of filters is adapted to receive a first control signal; a first set of switching devices serially connected therebetween, wherein: a first switching device in the first set of switching devices is configured to receive the input signal, a last switching device in the first set of switching devices is configured to transmit the input signal, and each switching device is connected with a filter in the plurality of filters and configured to receive an output of the filter; and a second set of switching devices, wherein each switching device in the second set of switching devices: is connected on one end with a switching device in the first set of switching devices, is configured to receive a second control signal, and is configured to ground the input signal, wherein whether the switching arrangement transmits the input signal or grounds the input signal is based on values of the first and second control signals.

A method for transmitting an input signal to one or more output terminals or grounding the input signal using the switching arrangement according to the first aspect is also provided.

According to a second aspect, a switch element adapted to receive an input signal on one end and a control signal on another end is provided, the switch element comprising: a filter; a plurality of gate resistors connected with the filter; and a plurality of transistors serially connected therebetween, wherein a gate of each transistor in the plurality of transistors is connected with a gate resistor in the plurality of gate resistors.

According to a third aspect, a method for transmitting an input signal to one or more output terminals or grounding the input signal is provided, the method comprising: providing a plurality of filters; providing a first set of switching devices serially connected therebetween, wherein each switching device in the first set of switching devices is either in a first state or a second state and configured to receive an output of a filter in the plurality of filters; providing a second set of switching devices, wherein each switching device in the second set of switching devices is either in a first state or a second state; applying the input signal to a first switching device in the first set of switching devices; applying a first control signal to each filter in the plurality of filters, wherein state of each switching device in the first set of switching devices is based on the first control signal applied to the plurality of filters; applying a second control signal to each switching device in the second set of switching devices, wherein state of each switching device in the second set of switching devices is based on the second control signal; transmitting the input signal to the one or more output terminals when each switching device in the first set of switching devices is in the first state; and grounding the input signal to a ground terminal when each switching device in the second set of switching devices is in the first state.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1A:
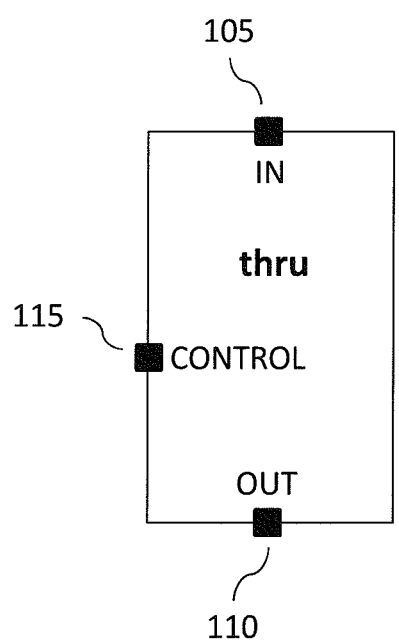
FIGS. 1A and 1B show exemplary diagrams of an individual series switch and an individual shunt switch, respectively, which illustrate input terminals and output terminals of the series and shunt switches.

One way to increase isolation of a switching arrangement (or equivalently, decrease coupling of a signal from an input terminal to an output terminal when the switching arrangement is turned OFF) is to reduce off-state capacitances of switching devices that form the switching arrangement.

These off-state capacitances can cause current flow through various conducting paths, and in particular from the input terminal to the output terminal, even when the switching devices are turned off. An exemplary range of large isolation values is between 40 dB and 60 dB.

In an implementation of a field-effect transistor (FET) switch operating at radio frequencies (RF), a plurality of FETs is serially connected (i.e., forming a stack of FETs) with a resistor $R_G$ connected with a gate of each FET in the stack of FETs. A first FET in the stack of FETs is configured to receive an RF input. Resistance of each resistor $R_G$ is generally larger than an output impedance of a control circuit adapted to drive (e.g., provide a signal to) the stack of FETs and is also generally larger than an input impedance of each FET. Each resistor $R_G$ is adapted to receive a control signal from the control circuit. The control signal determines whether the FET switch is closed or open (turned ON or OFF, respectively).

In general, each of the resistors $R_G$ connected with the gate of each FET has substantially the same resistance value. This implementation can be used to yield instantaneous RF voltage shared (substantially) equally among all the FETs in the stack of FETs. Equal sharing of voltage across each FET in the stack of FETs reduces chances of the instantaneous voltage across any one FET becoming too high, which would lead the particular FET to break down and summarily cause the other FETs in the stack to break down.

Each FET switch is associated with a time constant $\tau = R_G \times C_G$, where $C_G$ denotes parasitic gate capacitances. Consequently, the parasitic gate capacitances, together with the resistor $R_G$, form an RC filter. The time constant quantifies time involved for a FET switch to change states (i.e., from an ON state to an OFF state or vice versa) and thus determines frequency response of the FET. This time constant $\tau$ can also be referred to as a switching time.

To implement a switch that can rapidly change states, resistance value of $R_G$ should be low to yield a lower time constant $\tau$. However, a driver circuit that drives the FET switch, such as an amplifier coupled with the FET switch, does not have zero output impedance and similarly each FET in the stack of FETs does not have zero input impedance. Consequently, decreasing the resistance value of $R_G$ can yield an $R_G$ that is not large relative to the output impedance of the driver circuit and/or the input impedance of each FET, which in turn can lead to instantaneous RF voltage not being shared equally across each FET in the stack of FETs.

For an RF FET switch with a small switching time $\tau$ (generally implemented with a small $R_G$), the RF input signal provided to the RF FET switch by the driver circuit can be coupled from an input of the RF FET switch to an output of the RF FET switch via the $R_G$ path. Existence of the $R_G$ path can limit amount of signal isolation that can be achieved by the RF FET switch. On the other hand, a large $R_G$ would greatly attenuate the RF input signal that is coupled from the input to the output via the $R_G$ path, but the large $R_G$ leads to larger switching times. Consequently, a tradeoff exists between switch isolation and switching time.

According to many embodiments of the present disclosure, design of transistor switching arrangements is discussed. The switching arrangement can be implemented using a plurality of series switches and shunt switches. As will be discussed in more detail later in the present disclosure, each of these series and shunt switches comprises one transistor or multiple serially connected transistors (also referred to as stacked transistors). It should be noted that although the embodiments of the switching arrangement comprises FET transistors, diodes, bipolar junction transistors, and other diode-arrangements identifiable by a person skilled in the art can also be utilized in the design of the switching arrangements.

For the purposes of discussion, the switching arrangements are assumed to be adapted for operation at radio frequencies and can thus be referred to as RF switching arrangements. However, the switching arrangements can also operate at frequencies outside of the RF regime.

For clarity purposes, as used in this disclosure, the term "transistor" can refer to a single transistor or a stack of transistors, where the stack of transistors comprises transistors serially connected source to drain.

According to many embodiments of the present disclosure, a small switching time for the RF switching arrangement is generally considered to be in the nanosecond regime (e.g., nanoseconds or tens of nanoseconds) whereas a large switching time is generally considered to be in the microsecond regime (e.g., tens of microseconds).

Figure 1B:
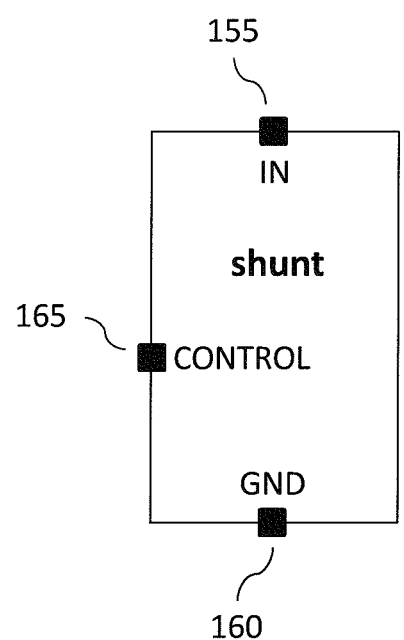

FIGS. 1A and 1B show exemplary diagrams of an individual series switch (100) and an individual shunt switch (150), respectively. The series switch (100) can also be referred to as a "through" switch, since the series switch (100) provides a path or a portion of a path from an input terminal of an RF switching arrangement to an output terminal of the RF switching arrangement. Each series switch (100) comprises an input terminal IN (105), an output terminal OUT (110), and a control terminal CONTROL (115). The IN terminal (105) receives an input to the series switch (100), which can be an input RF signal or an output of another series or shunt switch. The OUT terminal (110) of the series switch (100) provides an output signal of the series switch (100), which can be an output to another series or shunt switch or an output of the RF switching arrangement. The CONTROL terminal (115) receives a voltage to be applied to each gate in the stack of transistors that form the series switch (100), and thus controls whether a particular series switch is closed (turned ON) or open (turned OFF).

Similarly, each shunt switch (150) comprises an input terminal IN (155), a ground terminal GND (160), and a control terminal CONTROL (165). The IN terminal (155) of the shunt switch (150) receives an input to the shunt switch (150), which can be an input RF signal or an output of a series switch. The GND terminal (160) is tied to a ground potential (generally 0 V). The CONTROL terminal (165) of the shunt switch (150) receives a voltage to be applied to each gate in the stack of transistors that form the shunt switch (150), and thus controls whether a particular shunt switch is closed (turned ON) or open (turned OFF).

Figure 2:
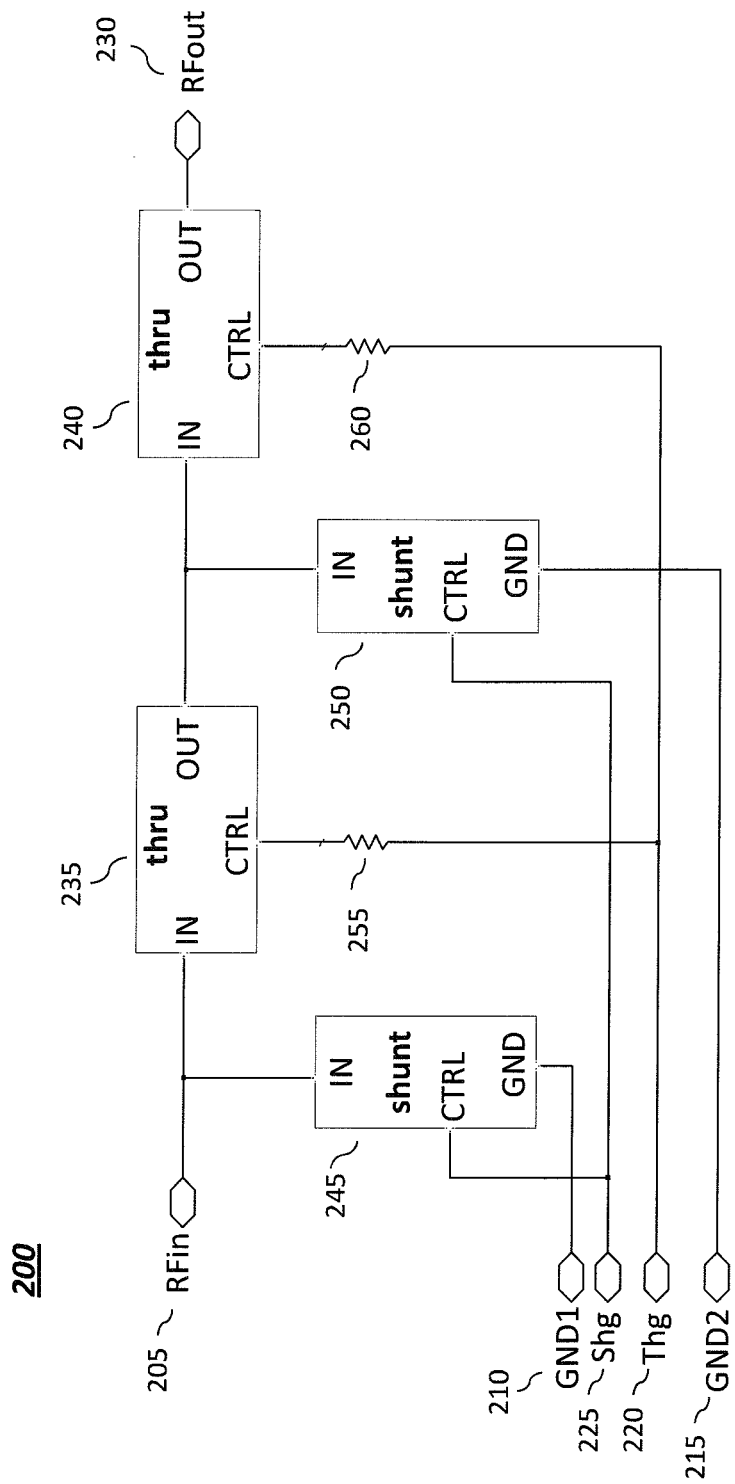
FIG. 2 shows an embodiment of a switching arrangement comprising series switches, shunt switches, and filters connected with the series switches.

FIG. 2 shows an embodiment of a radio frequency (RF) switching arrangement (200) comprising series switches (235, 240), shunt switches (245, 250), and filters (255, 260) connected with the series switches (235, 240). Specifically, the RF switching arrangement (200) of FIG. 2 comprises two series switches (235, 240), two shunt switches (245, 250), and two filters (255, 260).

As shown in FIG. 2, the filters (255, 260) can be tied to the CONTROL terminal (115 in FIG. 1A) of each series switch (235, 240), where the filter (255, 260) comprises a resistor (255, 260) and parasitic capacitances (not shown) tied from each terminal (205, 220, 225, 230) to ground (210, 215). These resistors (255, 260) can also be referred to as filtering resistors (255, 260). More in particular, the filter (255, 260) can be formed by the resistor (255, 260) and a component of the parasitic capacitance (such as a parasitic capacitance from wiring metal) tied between each resistor (255, 260) and ground (210, 215). These filters (255, 260) can improve isolation, as will be discussed later in the disclosure.

In another embodiment, the filters (255, 260) can be formed by a resistor (255, 260) and one or more explicit capacitors. In yet another embodiment, the filters (255, 260) can be formed by a resistor (255, 260) and an explicit inductor.

The RF switching arrangement (200) is adapted to receive an RF input at an input terminal (205) and to provide an RF output to an output terminal (230). A digital control signal at a Thg terminal (220), short for "through gate" terminal, is applied to the CONTROL terminal (115 in FIG. 1A) of each series switch (235, 240). In a first state, generally referred to as a HIGH logic state and corresponding with a high voltage level, the series switches (235, 240) are closed (i.e., turned ON). In a second state, generally referred to as a LOW logic state and corresponding with a low voltage level, the series switches (235, 240) are open (i.e., turned OFF).

Similarly, a digital control signal at a Shg terminal (225), short for "shunt gate" terminal, is applied to the CONTROL terminal (165 in FIG. 1B) of each shunt switch (245, 250). In a first state, the shunt switches (245, 250) are closed (i.e., turned ON). In a second state, the shunt switches (245, 250) are open (i.e., turned OFF). The digital control signals at the Thg and Shg terminals (220, 225) are provided by a corresponding control circuit (not shown) adapted to control ON and OFF state of the series switches (235, 240) and the shunt switches (245, 250).

The digital control signals at the Thg and Shg terminals (220, 225) are generally complementary (logical inverses) of each other. Consequently, when the through gate control signal at the Thg terminal (220) is in the first state and thus the series switches (235, 240) are closed (turned ON), the shunt gate control signal at the Shg terminal (225) is in the second state and thus the shunt switches (245, 250) are open (turned ON). Similarly, when the through gate control signal at the Thg terminal (220) is in the second state and thus the series switches (235, 245) are open, the shunt gate control signal at the Shg terminal (225) is in the first state and thus the shunt switches (245, 250) are closed (turned ON).

When the RF switching arrangement (200) is turned OFF, which occurs when the series switches (235, 240) are turned OFF and the shunt switches (245, 250) are turned ON, the RF input at the RF input terminal (205) gets grounded to ground terminals (210, 215) by the shunt switches (245, 250). Under these circumstances, the shunt gate control signal at the Shg terminal (225) are in the first state (generally HIGH logic state) and the shunt switches (245, 250) are turned ON while the through gate control signal at the Thg terminal (220) are in the second state (generally LOW logic state) and the series switches (235, 240) are turned OFF.

When the RF switching arrangement (200) is turned ON, which occurs when the series switches (235, 240) are turned ON and the shunt switches (245, 250) are turned OFF, the RF input at the RF input terminal (205) is transmitted through both series switches (235, 240) and to the output terminal (230). The output terminal (230) can be tied to, for instance, an antenna, a power amplifier, or any other device adapted to receive (and possibly further process and/or transmit) the RF output of the RF switching arrangement (200). Under these circumstances, the through gate signal at the Thg terminal (220) are in the first state (generally HIGH logic state) and the series switches (235, 240) are turned ON while the shunt gate signal at the Shg terminal (225) are in the second state (generally LOW logic state) and the shunt switches (245, 250) are turned OFF.

As previously mentioned, the filters (255, 260) can improve isolation. Specifically, the filters (255, 260) reduce coupling between signals at the CONTROL terminals (115 in FIG. 1A) of each series switch (235, 240) and signals at the IN terminal (105 in FIG. 1A) and the OUT terminal (110 in FIG. 1A) of each series switch (235, 240). Exemplary resistance values of each filter (255, 260) are around the tens of kiloohms to hundreds of kiloohms while exemplary values for the parasitic capacitance associated with these filters (255, 260) are around 10 fF to 100 fF. An exemplary time constant can be on the order of around 0.1 ns. It should be noted that time constants associated with the filters (255, 260) can vary over a wide range.

To illustrate coupling even when the series switches (235, 240) are in an OFF state, consider a case where there is an RF signal at the RF input (205) that should be isolated from the output terminal (230). A parasitic gate-to-source capacitance of a FET (in the stack of FETs) of the first series switch (235) can couple the RF signal at the RF input (205) to the Thg terminal (220). The Thg terminal (220) can then couple the RF signal to a FET (in the stack of FETs) of the second series switch (240), which then couples the RF signal to the output terminal (230). Consequently, the RF signal at the input terminal (205) is coupled to the output terminal (230) even though the series switches (235, 240) are OFF. The filters (255, 260) can act as a low pass filter that reduces (or prevents) such coupling. In some embodiments of the present disclosure, use of the filters (255, 260) can yield an increase of 5 to 10 dB in the isolation of the RF switching arrangement (200) relative to not employing the filters (255, 260) in the RF switching arrangement (200).

It should be noted the ground terminals GND1 (210) and GND2 (215) are generally at a common DC potential (usually denoted 0 V). The ground terminals (210, 215) can be separate terminals, as shown in FIG. 2, or a common terminal for reduced chip/package area. As separate terminals, isolation can be improved in view of wiring limitations present in RF connections. Any common impedance from sharing of wires between the various terminals (205, 210, 215, 220, 225, 230), such as the sharing of a wire between the ground terminals (210, 215), can introduce common impedance coupling. The common impedance coupling, which can include bond wire inductance, can degrade isolation performance.

Figure 3:
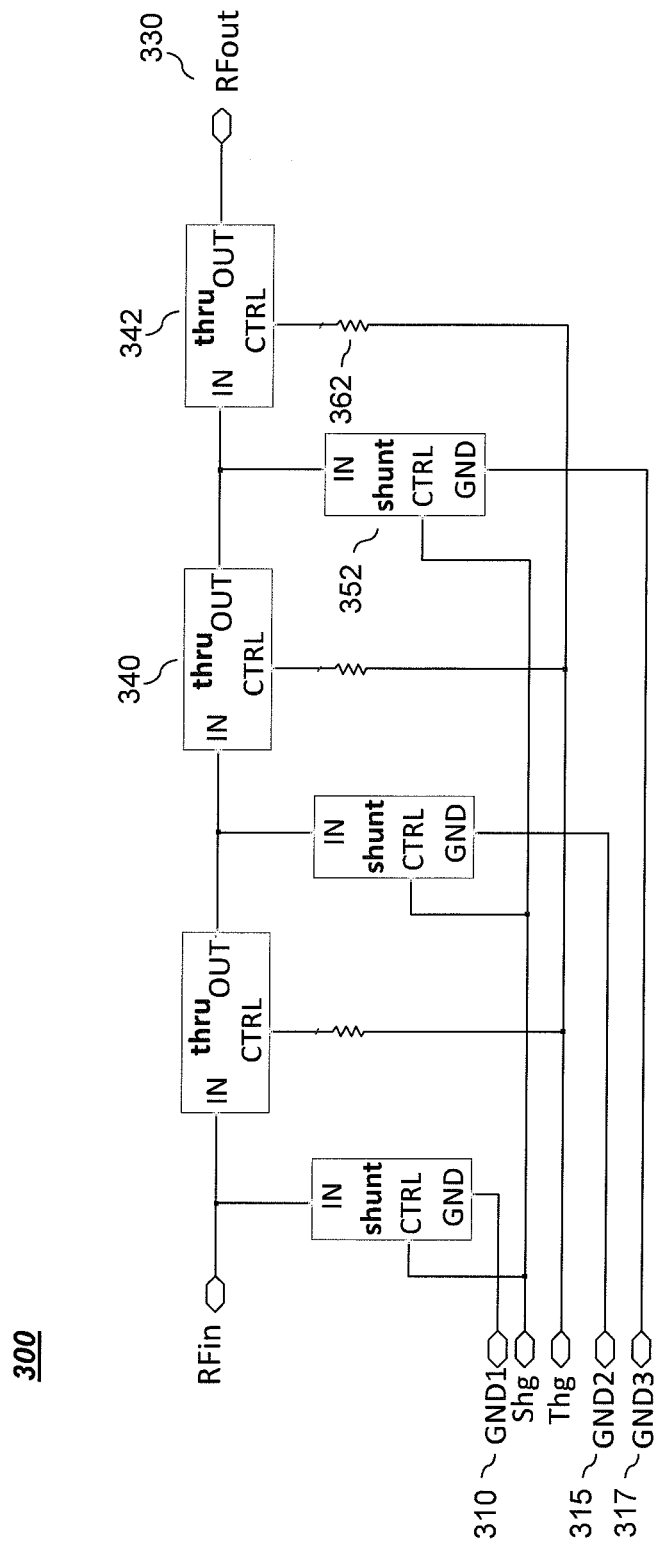
FIG. 3 shows another embodiment of a switching arrangement.

FIG. 3 shows an embodiment of the RF switching arrangement (300) comprising three series switches and three shunt switches. Specifically, a third series switch (342) is coupled to a second series switch (340) and an output terminal (330), and a third shunt switch (352) is coupled to the second series switch (340) and the third series switch (342). The third series switch (342) is tied to a filter (362) comprising a resistor (362) and parasitic capacitances (not shown) coupled to various terminals, including ground terminals (310, 315, 317).

The third shunt switch (352) can be tied to a ground terminal GND3 (317) that is at a common DC potential as ground terminals GND1 (310) and GND2 (315) corresponding with a first and second shunt switch, respectively. However, the ground terminals (310, 315, 317) can be three separate terminals to reduce common impedance coupling. The addition of a series and shunt switch pair relative to the switching arrangement of FIG. 2 can yield improved isolation in the OFF state but can also yield a corresponding increase in insertion loss in the ON state.

In a general case, but with reference to the reference numerals of FIG. 2, a switching arrangement can be described as follows. The switching arrangement (200) is adapted to receive an input signal (205) and either transmit the input signal (205) to an output terminal (230) or ground the input signal (205). The switching arrangement (200) comprises a plurality of filters (255, 260), a set of serially connected series switches (235, 240), and a set of shunt switches (245, 250).

Each filter (255, 260) can comprise a filtering resistor (255, 260) and a reactive component (not shown). The reactive component can be parasitic capacitances associated with the filters (255, 260), explicit capacitors, and/or explicit inductors. Each filter is configured to receive a through gate control signal at a Thg terminal (220), where the through gate control signal controls ON and OFF state of the series switches (234, 240).

Each series switch (235, 240) is connected with a filter (255, 260) in the plurality of filters (255, 260) and each series switch (235, 240) is configured to receive an output of the corresponding filter (255, 260). A first series switch (235) in the set of series switches is configured to receive the input signal (205) while a last switching device (240) in the set of series switches (235, 240) is configured to transmit the input signal (205) to the output terminal (230) when the series switches (235, 240) are closed (in an ON state). State (i.e., ON or OFF state) of each series switch (235, 240) is based on the output of the corresponding filter (255, 260). As is well known in the art, the input signal (205) generally endures losses while propagating through each series switch (235, 240), and thus the signal transmitted to the output terminal (230) via the last series switch (240) will generally be of lower magnitude than the input signal (205) received by the first series switch (235).

A first shunt switch (245) is connected with the first series switch (235) and is adapted to receive the input signal (205). The other shunt switch or shunt switches (250) are connected with one series switch (235) on one end and another series switch (240) on another end. Each shunt switch (245, 250) is configured to receive a shunt gate control signal at a Shg terminal (225). Depending on the shunt gate control signal, the shunt switches (245, 250) are either closed or open. The shunt switches (245, 250) are configured to ground the input signal (205) to a ground terminal or terminals (210, 215) when the shunt switches (245, 250) are closed.

Whether the switching arrangement (200) transmits the input signal (205) to the output terminal (230) or grounds the input signal (205) to the ground terminal or terminals (210, 215) is based on values of the through gate and shunt gate control signals (220, 225). The control signals (220, 225) can be complementary to each other such that the series switches (235, 240) and shunt switches (245, 250) are in opposite states.

A plurality of switching arrangements (200) can also be connected with each other. For instance, to form a larger switching circuit, a first set of switching arrangements can be utilized as series switches while a second set of switching arrangements can be utilized as shunt switches, where the first set of switching arrangements is coupled with the second set of switching arrangements.

Figure 4:
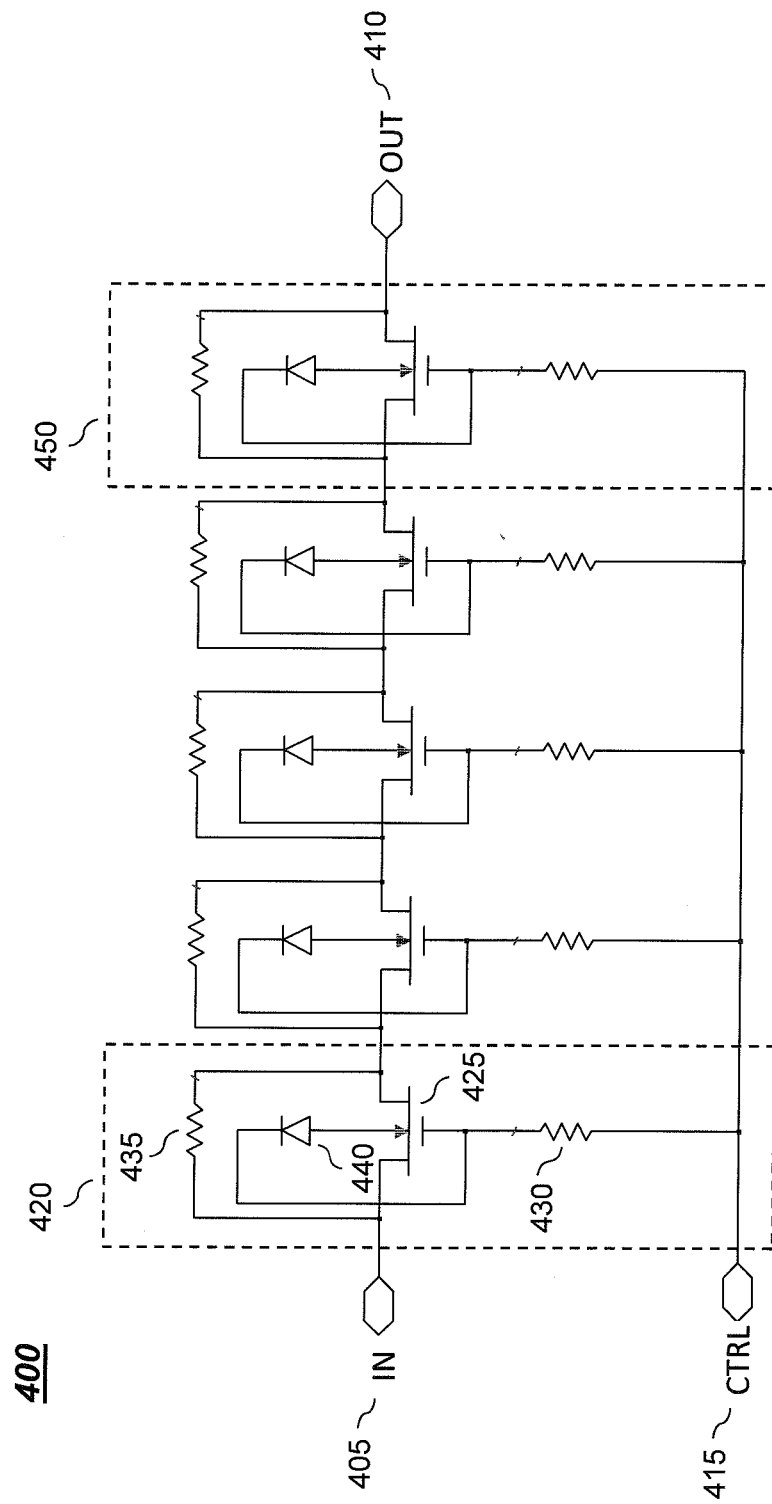
FIG. 4 shows an exemplary implementation of a series switch.

FIG. 4 shows an implementation of a series switch (400). The series switch (400) comprises a plurality of serially connected unit cells (420, 450). A first unit cell (420) is coupled to an input terminal IN (405), where the IN terminal (405) can be connected to an input RF signal (e.g., in the case of a first series switch (235 in FIG. 2)) or an output of a preceding series switch (not shown). A last unit cell (450) is coupled to an output terminal OUT (410), where the OUT terminal (410) can transmit an output signal to a subsequent series switch (not shown) or another device such as an antenna (not shown). It should be noted that if the OUT terminal (410) were tied to ground, FIG. 4 would show an implementation of a shunt switch.

Each unit cell (420, 450) comprises a transistor (425) and a gate resistor (430) coupled to a gate of the transistor (425). The gate resistor (430) aids in ensuring that RF voltage at the IN terminal (405) is shared equally (or substantially equally) across each transistor (425) in the stack of transistors. The gate resistor (430) across each transistor (425) also provides, in conjunction with the filters (255, 260 in FIG. 2), isolation between the RF voltage at the IN terminal (405) and a control circuit (not shown) at a CONTROL terminal (415), where a control signal at the CONTROL terminal (415) provided by the control circuit (not shown) controls ON and OFF state of the transistors in the series switch (400).

For operation of a particular unit cell (420), a parasitic capacitance coupled between the gate resistor (430) and ground (not shown) affects switching speed of the transistor (425) in particular and the series switch (400) in general. By affecting the switching speed of the series switch (400), switching speed of an RF switching arrangement comprising the series switch (400) would also be affected. An exemplary resistance value for the gate resistor (430) is in the hundreds of kiloohms while an exemplary value of a parasitic capacitance associated with the gate resistor (430) is around 10 pF. Consequently, an exemplary time constant is on the order of around hundreds of nanoseconds. Such exemplary values also hold for a shunt switch.

In general, a large proportion of parasitic capacitances present in the series and shunt switches (such as 235, 240, 245, 250 in FIG. 2) originate from parasitics of the transistor (425). According to some embodiments, time constants associated with the parasitic capacitance and gate resistor (430) are not insignificantly larger than time constants associated with the filters (255, 260) shown in FIG. 2. Speed of switching is dominated by the larger of the time constants (i.e., slower switching time). Therefore, in these embodiments, the time constants associated with the parasitic capacitance and gate resistor (430) shown in FIG. 4 dominate switching activity of the switching arrangement (such as 200 in FIG. 2).

Additionally, resistances of the gate resistors (430) shown in FIG. 4 is generally larger than resistances of the filtering resistors (255, 260) shown in FIG. 2. The larger resistances of the gate resistors (430 in FIG. 4) aid in ensuring substantially even voltage sharing for each transistor (425 in FIG. 4) in a stack of transistors. The filtering resistors (255, 260 in FIG. 2) are generally selected to provide an amount of isolation dependent on a particular application in which the switching arrangement is to be utilized without significantly affecting switching time of the switching arrangement.

Each unit cell (420, 450) can also comprise a source-to-drain resistor $R_{DS}$ (435) tied between a source and a drain of the transistor (425), which is used for maintaining DC bias, and/or a diode (440) connected from gate to body of the transistor (425), which can enhance linearity. The source-to-drain resistor $R_{DS}$ (435) allows determination of interior drain voltage of the transistor (425) when the series switch (400) is turned OFF. The linearity of the transistor (425) provides a measure of degree of linearity of current-voltage relationship of the transistor (425).

Design of an individual unit cell (420, 450) and selection of number of unit cells (420, 450) is based on overall switch specifications. By way of example and not of limitation, switch specifications generally include features such as insertion loss, isolation, power handling, linearity, and frequency response (switching time).

Number of unit cells (420, 450) used in implementing a series switch is a function of voltage or power that can be applied to the series switch. Generally, according to many embodiments of the present disclosure, number of unit cells in a series switch is the same as the number of unit cells in a shunt switch. However, the number of unit cells in the series and shunt switches need not be the same. Additionally, the number of unit cells between different series switches (and different shunt switches) need not be the same. Using different number of unit cells can affect, for example, insertion loss, isolation, and use of chip area relative to the case of equal number of unit cells. Size of each transistor (425) and each gate resistor (420) can also be designed to meet overall switch specifications.

Previous FIGS. 2 and 3 show single-pole-single-throw (SPST) RF switching arrangements (200, 300), where an input signal at an input terminal (205 in FIG. 2) can be coupled to an output terminal (230, 330) via the SPST RF switching arrangement (200, 300).

Figure 5A:
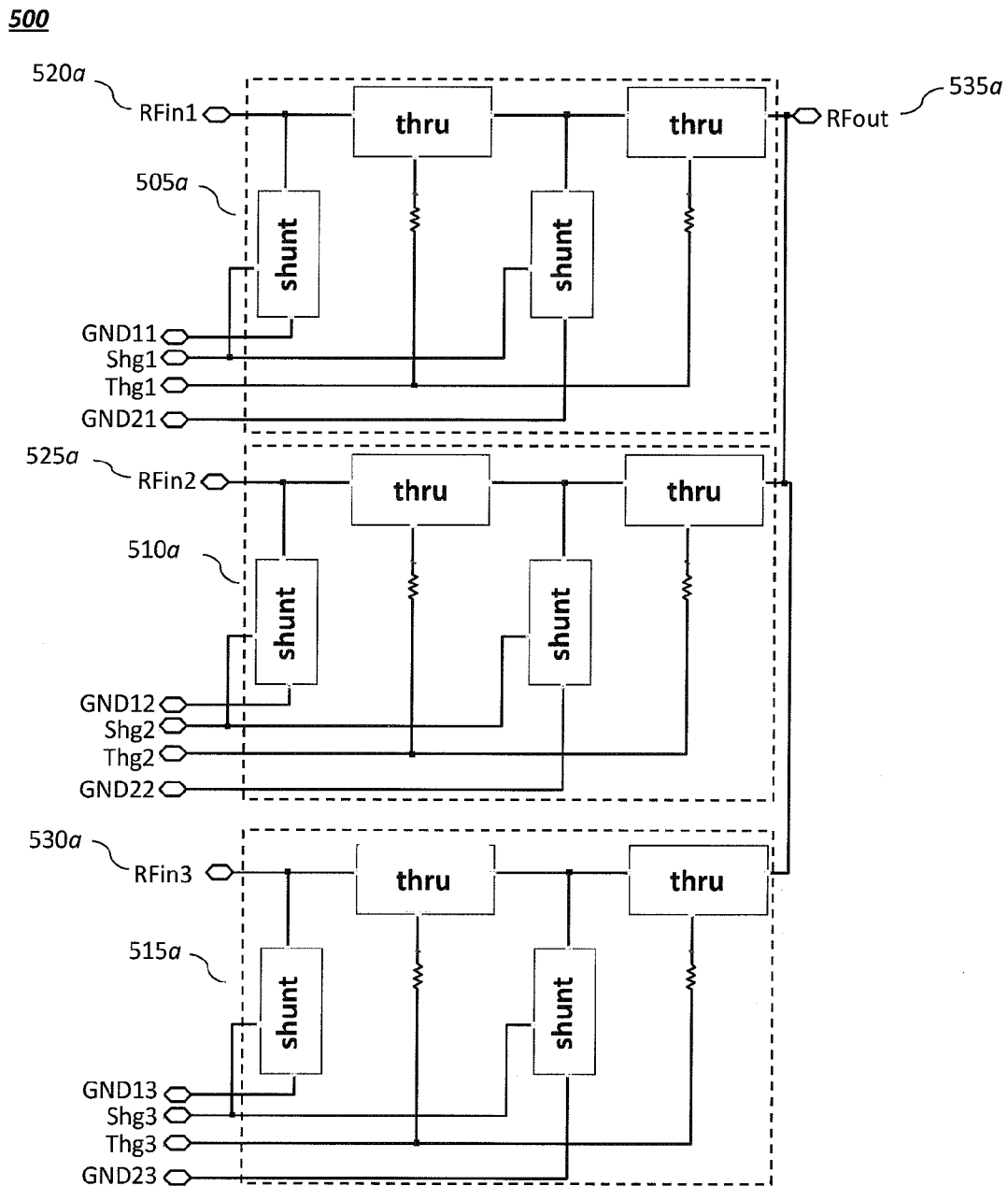
FIG. 5A shows an embodiment of a switch comprising a plurality of switching arrangements. According to an embodiment of the switch, the switching arrangements can be implemented using those switching arrangement shown in FIGS. 2 and/or 3.

FIG. 5A shows an embodiment of a RF switching arrangement (500) that comprises a plurality of SPST RF switches (505a, 510a, 515a) tied to a common output terminal RFout (535a). Each SPST RF switch (505a, 510a, 515a) in FIG. 5 is implemented using the RF switching arrangement (200) shown in FIG. 2, which comprises two series switches and two shunt switches. The SPST switching arrangement (300) of FIG. 3 as well as SPST switches with more series and/or shunt switches can also be used. The SPST RF switching arrangements (505a, 510a, 515a) are adapted to receive RF inputs RFin1 (520a), RFin2 (525a), and RFin3 (530a), respectively, which can be different from each other. Number of unit cells (e.g., 420, 450 in FIG. 4) in each SPST RF switching arrangement (505a, 510a, 515a) is generally not the same since switching specifications (e.g., isolation, power handling, and frequency response) associated with each RF input terminal (520a, 525a, 530a) is generally not the same.

The RF inputs (520a, 525a, 530a) corresponding to the SPST RF switching arrangement (505a, 510a, 515a) that is closed (turned ON) will be coupled to the output terminal ANT (535a). For example, if a first SPST RF switching arrangement (505a) is closed (turned ON), the RF input RFin1 (520a) would be coupled to the output terminal ANT (535a). The other SPST RF switching arrangements (510a, 515a) would be open (turned OFF), and the RF inputs RFin2 (525a) and RFin3 (530a) will be grounded via respective ground terminals of the other SPST RF switches (510a, 515a). In this case, isolation reduces (or prevents) coupling between any portion of the RFin2 (525a) and RFin3 (530a) signals and the output terminal RFout (535a). Coupling can also be reduced (or prevented) between each of the RF switching arrangements (505a, 510a, 515a).

Figure 5B:
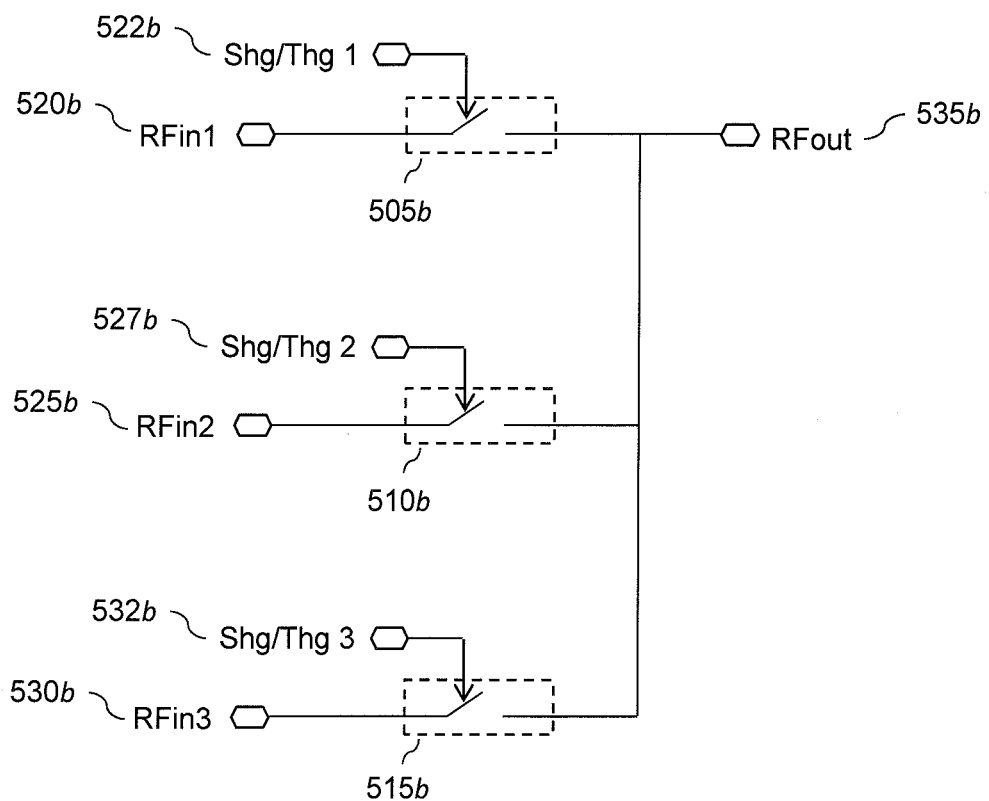
FIG. 5B shows a schematic of the switch of FIG. 5A.

FIG. 5B shows a schematic of the RF switching arrangement (500) of FIG. 5A. Each SPST RF switching arrangement (505b, 510b, 515b) is coupled with an input RF signal (505b, 510b, 515b) and corresponding control signal pairs at respective Shg/Thg terminals (522b, 527b, 532b), where each Shg/Thg terminal pair (522b, 527b, 532b) is depicted, for example, in FIG. 2 as Shg (225) and Thg (220). Each SPST RF switching arrangement (505b, 510b, 515b) is adapted to be coupled with an output terminal RFout (535b). The output terminal RFout (535b) is coupled with an input RF signal (520b, 525b, 530b) corresponding to the SPST RF switching arrangement (505b, 510b, 515b) that is closed (turned ON).

Figure 6A:
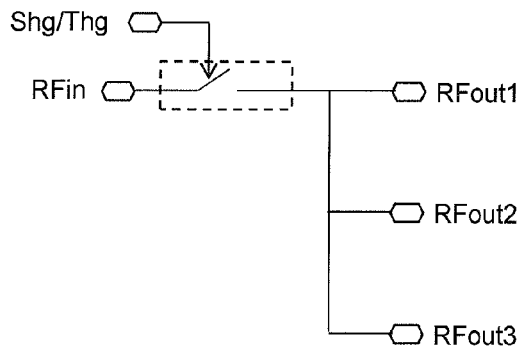
FIGS. 6A-6C show additional embodiments of switches comprising a plurality of switching arrangements.
Figure 6B:
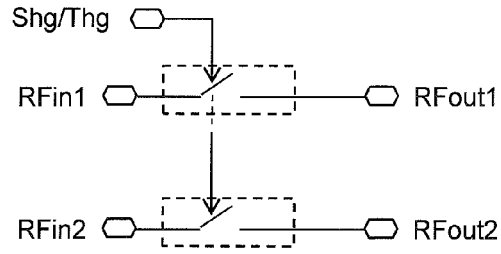
Figure 6C:
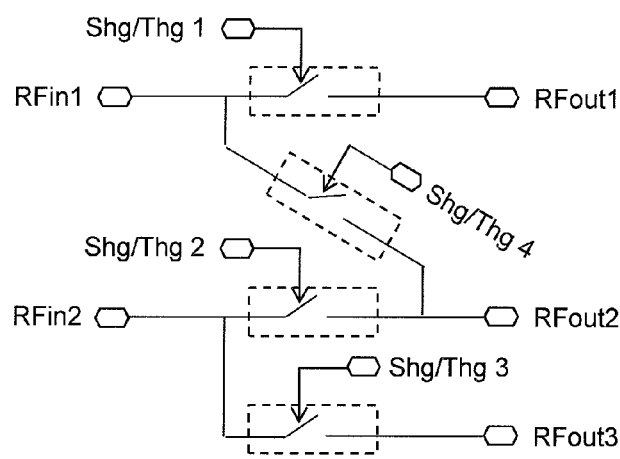

FIGS. 6A-6C show additional embodiments of RF switching arrangements. In the RF switching arrangement shown in FIG. 6A, an RF signal can be sent to multiple output terminals via a single RF switching arrangement that is closed (turned ON). The RF signal can be grounded when the single RF switching arrangement is open (turned OFF). A plurality of output terminals RFout1, RFout2, and so forth, will all be coupled to a common input RF signal via the single RF switching arrangement when the single RF switching arrangement is closed (turned ON). If the single RF switching arrangement is open (turned OFF), the input RF signal will be grounded and the output terminals will not receive the input RF signal.

The switching arrangement shown in FIG. 6B shows two RF switching arrangements controlled by a common digital control signal pair at the Shg/Thg terminal pair. Generally, in such a switching arrangement, either both RF switching arrangements are closed (turned ON) or both are open (turned OFF).

In the RF switching arrangement shown in FIG. 6C, various combinations of couplings between multiple input RF signals and multiple output terminals can be achieved by closing and opening the various RF switching arrangements. Each RF switching arrangement can be implemented using the RF switching arrangements (200, 300) shown in FIGS. 2 and 3, as well as RF switching arrangements with additional series and shunt switches. Other exemplary combinations and connections of the switch elements (series and shunt switches) can be made depending on application of a particular switching arrangement.

The examples set forth above are provided to give those of ordinary skill in the art a complete disclosure and description of how to make and use the embodiments of the method and apparatus for transistor switch isolation of the disclosure, and are not intended to limit the scope of what the inventor regard as his disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A switching arrangement adapted to receive an input signal and either transmit the input signal or ground the input signal, comprising:
　a plurality of filters, wherein each filter in the plurality of filters is adapted to receive a first control signal and to transmit the first control signal to an output of the filter with a corresponding filter time constant;
　a first set of switching devices serially connected therebetween, wherein:
　　a first switching device in the first set of switching devices is configured to receive the input signal,
　　a last switching device in the first set of switching devices is configured to transmit the input signal, and
　　each switching device is connected with a filter in the plurality of filters and configured to receive the output of the filter and react to the output of the filter with a corresponding switch time constant larger than the filter time constant; and a second set of switching devices, wherein each switching device in the second set of switching devices:
is connected on one end with a switching device in the first set of switching devices,
is connected on a second end to a ground terminal,
is configured to receive a second control signal, and
is configured to ground the input signal,
wherein whether the switching arrangement transmits the input signal or grounds the input signal is based on values of the first and second control signals, and wherein a switching speed of the switching arrangement is dominated by the switch time constant.

2. The switching arrangement according to claim 1, wherein:
each switching device in the first set of switching devices is either in a first state or a second state based on the value of the first control signal to be applied to each switching device in the first set of switching devices,
a last switching device in the first set of switching devices is configured to transmit the input signal when the last switching device in the first set of switching devices is in the first state,
each switching device in the second set of switching devices is either in a first state or a second state based on the value of the second control signal to be applied to each switching device in the second set of switching devices,
a first switching device in the second set of switching devices is connected with the first switching device in the first set of switching devices and configured to receive the input signal, wherein the first switching device in the second set of switching devices, when in the first state, grounds the input signal, and
each remaining switching device in the second set of switching devices is connected with one switching device in the first set of switching devices on a first end and to another switching device in the first set of switching devices on a second end, wherein the remaining switching devices in the second set of switching devices, when in the first state, grounds signals at the first and second ends.

3. The switching arrangement according to claim 1, wherein each switching device in the first set of switching devices comprises:
a plurality of transistors serially connected therebetween;
a plurality of gate resistors each connected with a gate of a different transistor in the plurality of transistors at a first gate resistor terminal, and each connected with one filter in the plurality of filters at a second gate resistor terminal; and
a plurality of gate parasitic capacitances, each connected with a gate resistor of the plurality of gate resistors at the first gate resistor terminal,
wherein the switch time constant is defined by a gate parasitic capacitance of the plurality of gate parasitic capacitances and a corresponding gate resistor.

4. The switching arrangement according to claim 3, wherein:
each filter in the plurality of filters comprises a filtering resistor and a reactive element,
the combination of the filtering resistor and the reactive element provides the filter time constant, and
a resistance of the filtering resistor is at a value that reduces coupling of the input signal at an output terminal of the switching arrangement when the switching arrangement grounds the input signal.

5. The switching arrangement according to claim 4, wherein the reactive element is a parasitic capacitance with a capacitance value of 10 fF to 100 fF, the gate parasitic capacitance has a value of 10 pF, the gate resistor and the filtering resistor have similar resistance values and the switch time constant is 100 times or more larger than the filter time constant.

6. The switching arrangement according to claim 5, wherein the parasitic capacitance is coupled from the filtering resistor to the ground terminal.

7. The switching arrangement according to claim 4, wherein the plurality of filters provide an increase of 5-10 dB in the isolation at an output terminal of the switching arrangement with respect to the input signal.

8. The switching arrangement according to claim 3, wherein each switching device in the first set of switching devices further comprises:
a diode arrangement connected from gate to body in each transistor in the plurality of transistors.

9. The switching arrangement according to claim 3, wherein each switching device in the first set of switching devices further comprises:
a drain-to-source resistor connected between a drain and a source of each transistor in the plurality of transistors.

10. A method for transmitting an input signal to one or more output terminals or grounding the input signal, comprising:
providing the switching arrangement according to claim 1;
applying the input signal to a first switching device in the first set of switching devices;
applying a first control signal to each filter in the plurality of filters, wherein state of each switching device in the first set of switching devices is based on the first control signal applied to the plurality of filters;
applying a second control signal to each switching device in the second set of switching devices, wherein state of each switching device in the second set of switching devices is based on the second control signal;
transmitting the input signal to the one or more output terminals when each switching device in the first set of switching devices is in the first state;
reducing, via the plurality of filters, coupling of the input signal to the one or more output terminals when each switching device in the first set of switching devices is in the second state;
grounding, via each switching device in the second set of switching devices, the input signal to a ground terminal when the each switching device in the second set of switching devices is in the first state; and
based on the reducing and the grounding, increasing by 5-10 dB a signal isolation with respect to the input signal at the one or more output terminals.

11. A switch element configured to be part of a switching arrangement comprising a plurality of said switching elements, the switch element being adapted to receive an input signal on one end and a control signal on another end, the switch element comprising:
a filter;
a plurality of gate resistors connected with the filter at a first gate resistor terminal; and
a plurality of transistors serially connected therebetween, wherein a gate of each transistor in the plurality of transistors is connected with a gate resistor in the plurality of gate resistors at a second gate terminal of the gate resistor, wherein the filter is configured to reduce coupling of the input signal to an output terminal of the switching arrangement without affecting a switching time of the switch element.

12. The switch element according to claim 11, wherein the filter comprises a filtering resistor and a reactive element.

13. The switch element according to claim 12, wherein the reactive element is a parasitic capacitance.

14. The switch element according to claim 13, wherein the parasitic capacitance is coupled from the filtering resistor to ground.

15. The switch element according to claim 12, wherein resistance value of each gate resistor in the plurality of gate resistors is higher than resistance value of the filtering resistor.

16. The switch element according to claim 11, further comprising a diode arrangement connected from gate to body in each transistor in the plurality of transistors.

17. The switch element according to claim 11, further comprising a drain-to-source resistor connected between a drain and a source of each transistor in the plurality of transistors.

18. A method for transmitting an input signal to one or more output terminals or grounding the input signal, comprising:

providing a plurality of filters;

providing a first set of switching devices serially connected therebetween, wherein each switching device in the first set of switching devices is either in a first state or a second state and configured to receive an output of a filter in the plurality of filters;

providing a second set of switching devices, wherein each switching device in the second set of switching devices is either in a first state or a second state;

connecting, for each switching device of the second set of switching devices, a first end of the each switching device to a switching device of the first set of switching devices, and a second end of the each switching device to a ground terminal;

applying the input signal to a first switching device in the first set of switching devices;

applying a first control signal to each filter in the plurality of filters, wherein state of each switching device in the first set of switching devices is based on the first control signal applied to the plurality of filters, and wherein a switching speed of each switching device is dominated by a switch time constant larger than a time constant associated to the each filter;

applying a second control signal to each switching device in the second set of switching devices, wherein state of each switching device in the second set of switching devices is based on the second control signal;

transmitting the input signal to the one or more output terminals when each switching device in the first set of switching devices is in the first state;

reducing, via the plurality of filters, coupling of the input signal to the one or more output terminals when each switching device in the first set of switching devices is in the second state;

grounding, via each switching device of the second set of switching devices, the input signal to a ground terminal when the each switching device in the second set of switching devices is in the first state; and based on the reducing and the grounding, increasing by 5-10 dB a signal isolation with respect to the input signal at the one or more output terminals.

19. The method according to claim 18, wherein the first and second control signals are complementary to each other.

20. The method according to claim 18, wherein the transmitting is performed via a last switching device in the first set of switching devices.

* * * * *